(12) United States Patent
Peng et al.

(10) Patent No.: US 11,682,552 B2
(45) Date of Patent: Jun. 20, 2023

(54) APPARATUS FOR CHEMICAL MECHANICAL POLISHING PROCESS

(71) Applicant: Taiwan Semiconductor Manufacturing Co., Ltd., Hsinchu (TW)

(72) Inventors: Chih-I Peng, Hsinchu (TW); Hsiu-Ming Yeh, Hsinchu (TW); Yi-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 328 days.

(21) Appl. No.: 16/659,293

(22) Filed: Oct. 21, 2019

(65) Prior Publication Data

US 2020/0051809 A1 Feb. 13, 2020

Related U.S. Application Data

(62) Division of application No. 15/964,632, filed on Apr. 27, 2018, now Pat. No. 10,460,926.
(Continued)

(51) Int. Cl.
*H01L 21/02* (2006.01)
*H01L 21/677* (2006.01)
(Continued)

(52) U.S. Cl.
CPC ........ *H01L 21/02057* (2013.01); *B24B 37/10* (2013.01); *H01L 21/02074* (2013.01);
(Continued)

(58) Field of Classification Search
None
See application file for complete search history.

(56) References Cited

U.S. PATENT DOCUMENTS 5,611,943 A * 3/1997 Cadien .................. B24B 53/017
438/692
6,095,899 A 8/2000 Elmar et al.
(Continued)

FOREIGN PATENT DOCUMENTS

CN 102626704 A 8/2012
CN 103100964 B 11/2015
(Continued)

OTHER PUBLICATIONS

Chinese Office Action and Search Report, dated Sep. 19, 2019, for Chinese Application No. 201811276372.1.

*Primary Examiner* — Sylvia MacArthur
(74) *Attorney, Agent, or Firm* — Birch, Stewart, Kolasch & Birch, LLP

(57) ABSTRACT

A system for performing a chemical mechanical polishing (CMP) process is provided. The system includes a CMP tool configured to polish a semiconductor wafer. The processing system further includes a wafer stage configured to support the semiconductor wafer for facilitating the insertion of the semiconductor wafer into, and its subsequent removal from, the CMP tool. The processing system also includes a number of spray nozzles positioned relative to the wafer stage. In addition, the processing system includes a spray generator connected to the spray nozzles and configured to convert a mixture to a mist spray. The processing system further includes a controller configured to activate flow of the mist spray from the spray generator to the spray nozzles to discharge the mist spray over the semiconductor wafer supported by the wafer stage.

20 Claims, 11 Drawing Sheets

Related U.S. Application Data

(60) Provisional application No. 62/587,782, filed on Nov. 17, 2017.

(51) Int. Cl.
 *H01L 21/67* (2006.01)
 *H01L 21/306* (2006.01)
 *B24B 37/10* (2012.01)

(52) U.S. Cl.
 CPC .. *H01L 21/30625* (2013.01); *H01L 21/67051* (2013.01); *H01L 21/67173* (2013.01); *H01L 21/67219* (2013.01); *H01L 21/67748* (2013.01); *H01L 21/67259* (2013.01)

(56) References Cited

U.S. PATENT DOCUMENTS

| | | | | |
|---|---|---|---|---|
| 6,102,784 | A * | 8/2000 | Lichner | H01L 21/67051 |
| | | | | 451/271 |
| 6,103,096 | A * | 8/2000 | Datta | H01L 21/67075 |
| | | | | 257/E21.216 |
| 6,300,247 | B2 * | 10/2001 | Prabhu | B24B 53/017 |
| | | | | 438/692 |
| 6,308,361 | B1 * | 10/2001 | Matsuda | H01L 21/67051 |
| | | | | 15/77 |
| 6,643,882 | B1 * | 11/2003 | Sotozaki | B08B 3/024 |
| | | | | 451/65 |
| 8,414,357 | B2 * | 4/2013 | Wang | B24B 37/04 |
| | | | | 451/41 |
| 2002/0045413 | A1 | 4/2002 | Sotozaki | |
| 2003/0015215 | A1 * | 1/2003 | Hsu | B24B 53/017 |
| | | | | 134/1 |
| 2005/0178504 | A1 | 8/2005 | Speh et al. | |
| 2006/0035563 | A1 * | 2/2006 | Kalenian | H01L 21/67219 |
| | | | | 451/5 |
| 2009/0301518 | A1 * | 12/2009 | Oikawa | B24B 37/04 |
| | | | | 134/1.3 |
| 2011/0031326 | A1 * | 2/2011 | Sato | H01L 21/02057 |
| | | | | 239/1 |
| 2014/0144465 | A1 * | 5/2014 | Kaneko | H01L 21/68728 |
| | | | | 134/4 |
| 2014/0216505 | A1 * | 8/2014 | Toyomasu | H01L 21/67017 |
| | | | | 134/36 |
| 2016/0083676 | A1 | 3/2016 | Mikhaylichenko et al. | |
| 2017/0287755 | A1 * | 10/2017 | Tanaka | H01L 21/67742 |
| 2017/0323807 | A1 * | 11/2017 | Kweon | H01L 21/67288 |
| 2018/0012780 | A1 * | 1/2018 | Shinozaki | C23C 16/442 |
| 2018/0315611 | A1 | 11/2018 | Isokawa | |
| 2020/0051809 | A1 * | 2/2020 | Peng | H01L 21/67051 |

FOREIGN PATENT DOCUMENTS

| | | |
|---|---|---|
| CN | 103878680 B | 3/2017 |
| CN | 106952804 A | 7/2017 |
| JP | 2010-508165 A | 3/2010 |
| KR | 2001-0064398 A | 7/2001 |
| TW | 201338919 A | 10/2013 |

\* cited by examiner

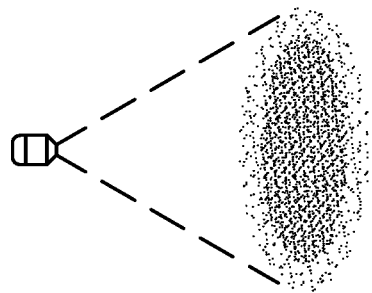
FIG. 3A
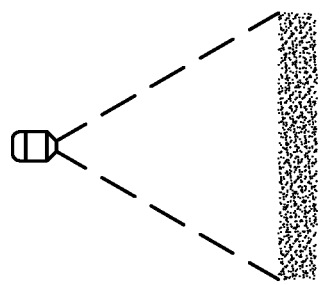
FIG. 3B
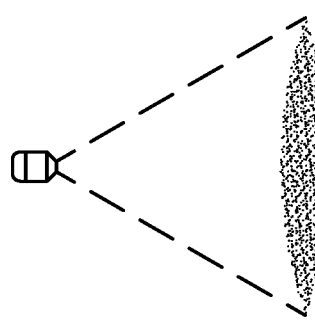
FIG. 3C
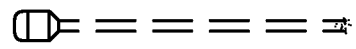
FIG. 3D
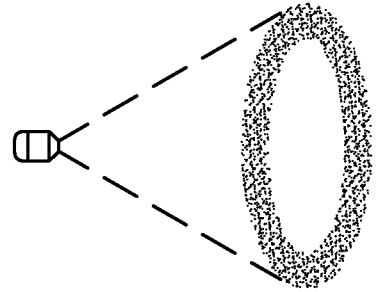
FIG. 3E
FIG. 3F

APPARATUS FOR CHEMICAL MECHANICAL POLISHING PROCESS

PRIORITY CLAIM AND CROSS-REFERENCE

This application is Divisional of application Ser. No. 15/964,632, filed on Apr. 27, 2018, which claims the benefit of U.S. Provisional Application No. 62/587,782, filed on Nov. 17, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing semiconductor wafer 5 with a series of wafer fabrication tools (i.e., "processing apparatus"). Each processing apparatus typically performs a single wafer fabrication task on the semiconductor wafer. For example, a chemical mechanical polishing (CMP) apparatus is used for performing a polishing process for planarization of semiconductor wafers. The polishing processes may be used to form planar surfaces on dielectric layers, semiconductor layers, and conductive material layers of a wafer, for example.

Although existing CMP systems have been generally adequate for their intended purposes, they have not been entirely satisfactory in all respects. Consequently, it would be desirable to provide a solution to improve the CMP systems so as to mitigate or avoid the production of excess scrap wafer due to defects formed during the polishing process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3A shows a schematic view of a flat fan type nozzle with a convex liquid distribution, in accordance with some embodiments.

FIG. 3B shows a schematic view of a flat fan type spray nozzle with an even liquid distribution, in accordance with some embodiments.

FIG. 3C shows a schematic view of a full cone type spray nozzle with a convex liquid distribution, in accordance with some embodiments.

FIG. 3D shows a schematic view of a full cone type spray nozzle with an even liquid distribution, in accordance with some embodiments.

FIG. 3E shows a schematic view of a hollow cone type spray nozzle with a concave liquid distribution, in accordance with some embodiments.

FIG. 3F shows a schematic view of a straight type spray nozzle with a single point liquid distribution, in accordance with some embodiments.

DETAILED DESCRIPTION

Figure 1:
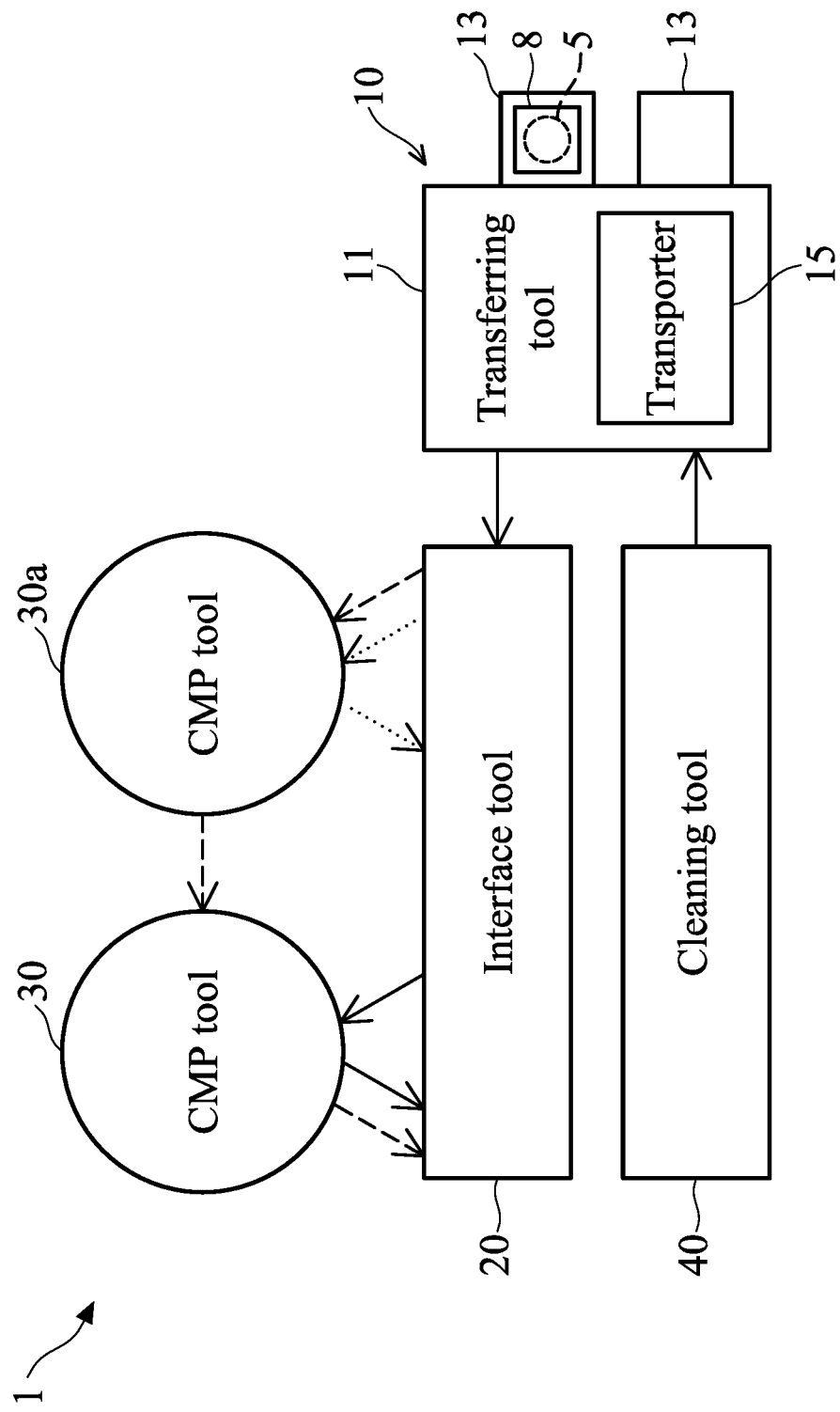
FIG. 1 shows a block diagram of a processing system in semiconductor fabrication, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a schematic view of a processing system 1 in accordance with some embodiments of the disclosure. The processing system 1 is configured to perform a mechanical chemical polishing (CMP) process on a semiconductor wafer 5.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the processing system 1 includes a transferring tool 10, an interface tool 20, one or more CMP tools, such as CMP tools 30 and 30a, and a cleaning tool 40. The elements of the processing system 1 can be added to or omitted, and the invention should not be limited by the embodiment.

The transferring tool 10 is configured to handle the semiconductor wafer 5 from a carrier 8. The transferring tool 10 includes a housing 11, one or more load ports 13 and one or more transporters 15, in accordance with some embodiments. In some embodiments, the interface module 10 includes an equipment front end module (EFEM). The load ports 13 are connected to the housing 11 and configured to load carriers 8 for storing one or more wafers 5.

The transporter 15, for example, includes a robotic arm, and is disposed within the housing 11. The transporter 15 is configured for physically transporting the semiconductor wafer 5. For example, the transporter 15 may transport the semiconductor wafer 5 from the carrier 8 to the housing 11, or the transporter 15 may transport the semiconductor wafer 5 to the interface tool 20, or the transporter 15 may retrieve the semiconductor wafer 5 from the cleaning tool 40. However, the locations where the transporter 15 may transport the semiconductor wafer 5 are not limited by the present embodiment.

The interface tool 20 is configured to support and dock the semiconductor wafer 5 for facilitating the insertion of the semiconductor wafer 5 into, and its subsequent removal from, the CMP tool 30. In addition, the interface tool 20 is configured to dock the semiconductor wafer 5 for facilitating the insertion of the semiconductor wafer 5 into the cleaning tool 40. In some embodiments, the interface tool 20 is positioned between the transferring tool 10, the CMP tool 30 and the cleaning tool 40, as shown in FIG. 1.

Figure 2:
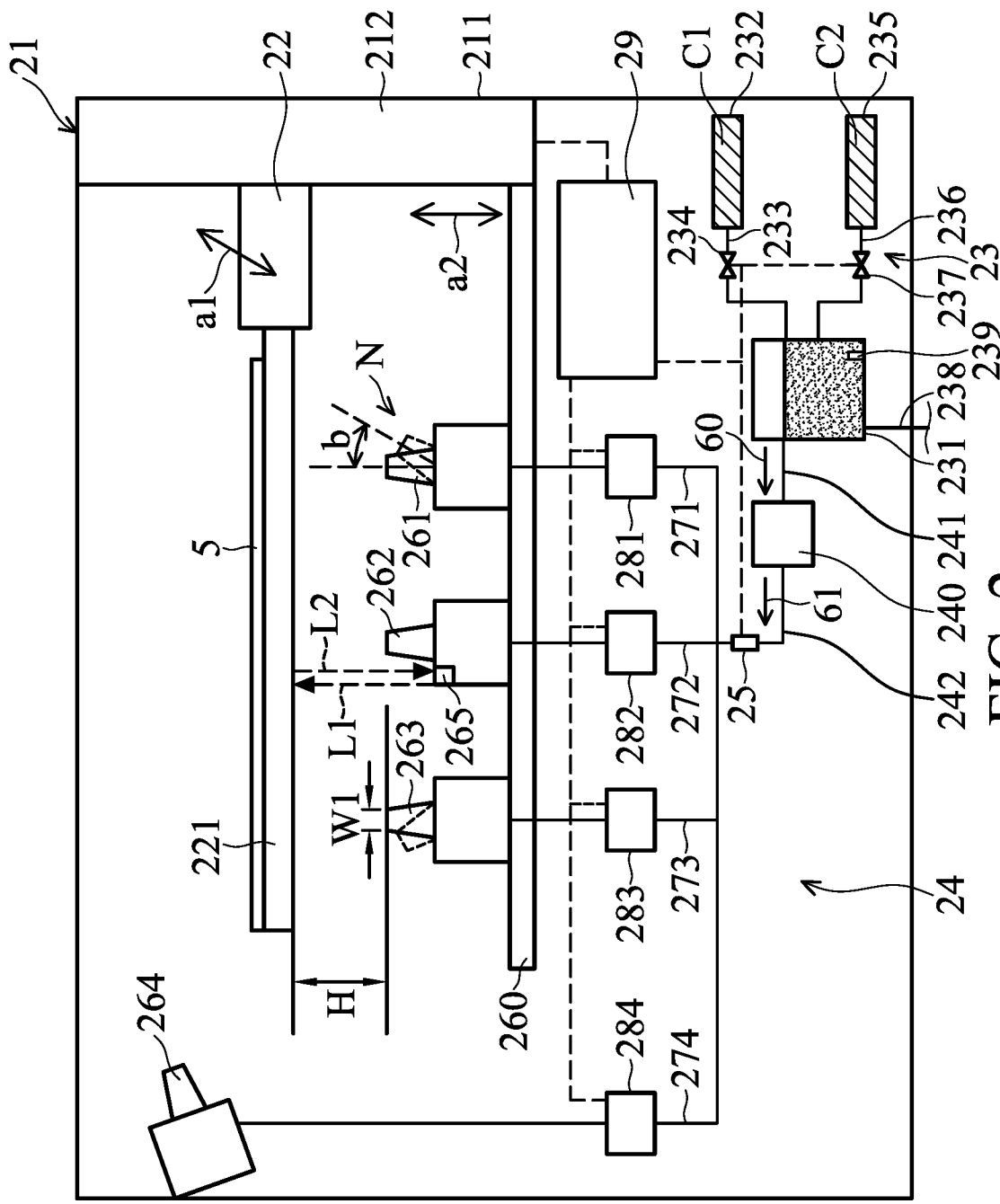
FIG. 2 shows a schematic view of an interface tool, in accordance with some embodiments.
Figure 4:
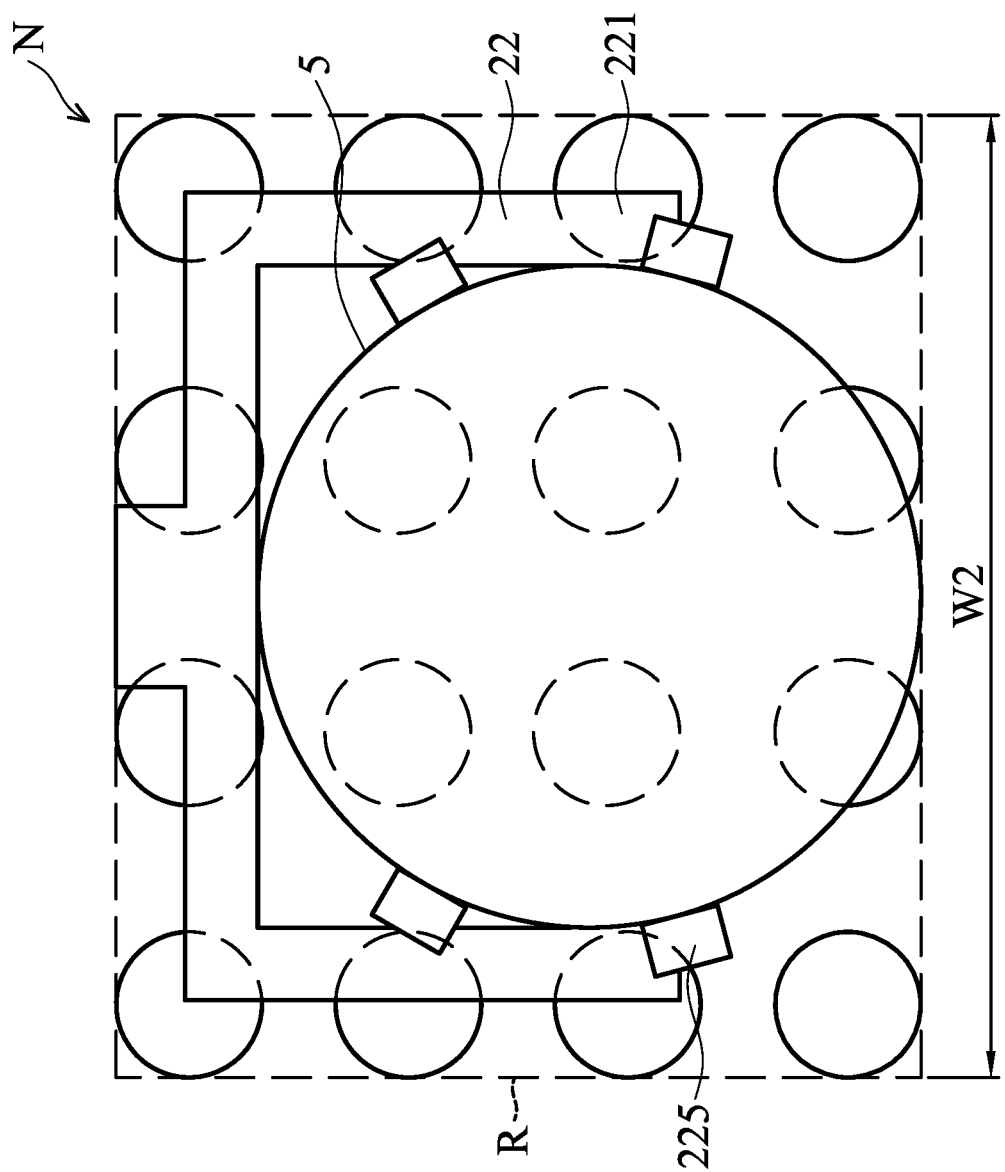
FIG. 4 shows a top view of an interface tool, in accordance with some embodiments.
Figure 5:
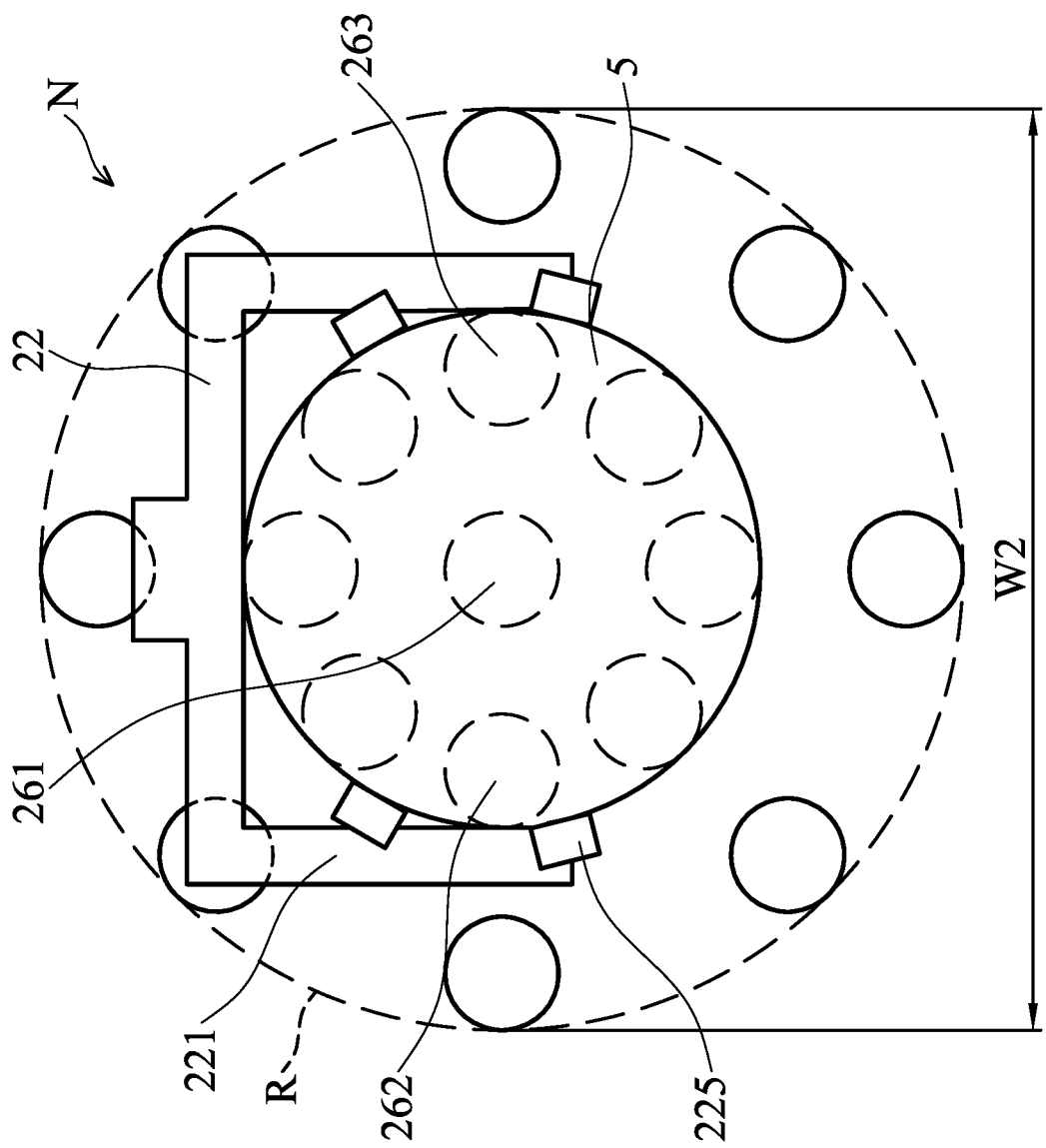
FIG. 5 shows a top view of an interface tool, in accordance with some embodiments.

FIG. 2 shows a schematic view of the interface tool 20, in accordance with some embodiments. In some embodiments, the interface tool 20 includes a chamber 21, a wafer stage 22, a liquid source module 23 and a liquid supply module 24, a heating module 25 and a discharging module 26.

The wafer stage 22 is positioned in the chamber 21 and is configured to support the semiconductor wafer 5 while the semiconductor wafer 5 is located in the interface tool 20. In some embodiments, the wafer stage 22 is connected to a side wall 211 of the chamber 21, and the wafer stage 22 is connected to an actuator assembly 212. The actuator assembly 212 may include a linear motor to move the wafer stage 22 horizontally along a direction as indicated by an arrow a1 shown in FIG. 2. However, it should be appreciated that many variations and modifications can be made to embodiments of the disclosure. In some other embodiments, the wafer stage 22 is fixed in the chamber 21.

In some embodiments, the liquid source module 23 includes a storage tank 231 having a relatively large volume and being operable to store a mixture 60 waiting to be converted to mist spray 61. In some embodiments, the liquid source module 23 further includes an outlet 238 connected to a liquid process system (not shown in figures) to exhaust waste mixture 60 from the storage tank 231. The mixture 60 stored in the storage tank 231 may include an aggregate of two or more substances. For example, the mixture 60 may include an aggregate of a chemical solution C1 from a material tank 232 and a chemical solution C2 from a material tank 235.

The material tank 232 is used to store the chemical solution C1. The chemical solution C1 is supplied to the storage tank 231 via a material supply line 233. A valve 234 is connected to the material supply line 233 to control the flow of the chemical solution C1. The material tank 235 is used to store the chemical solution C2. The chemical solution C2 is supplied to the storage tank 231 via a material supply line 236. A valve 237 is connected to the material supply line 236 to control the flow of the chemical solution C2.

In some embodiments, the chemical solution C1 includes deionized water (DIW), and the chemical solution C2 includes $NH_4OH$ solution or benzotriazole (BTA) solution. By controlling the amount of the chemical solution C1 and the chemical solution C2 flowing into the storage tank 231, the pH value of the mixture 60 can be changed.

In some embodiments, a pH meter 239 is positioned in the storage tank 231. In order to form a mixture 60 having a preset concentration, the controller 29 may control the valves 234 and/or 237 to change the flow of the chemical solution C1 and the chemical solution C2 in response to the detected signals. As a result, the pH value of the mixture 60 can be controlled.

The preset concentration is determined according to the material formed on the semiconductor wafer 5. For example, to prevent corrosion of a copper film formed on the semiconductor wafer 5, the pH value of the mixture 60 is maintained with in a range of about 8.5 to about 11.5. In another example, to prevent corrosion of a tungsten film formed on the semiconductor wafer 5, the pH value of the mixture 60 is maintained with in a range of about 1.5 to about 3.5. Other materials, such as cobalt film or ruthenium film, may use mixture 60 having different pH values (e.g. in a range of about 9.5 to about 12) to avoid corrosion. The chemical concentration may be in a range from about 4% to about 67% with an error of approximately 0.01%.

It should be appreciated that the number of the material tank should not be limited to the embodiments mentioned above. The number of material tank may be varied according to the number of substances in a desired mixture.

The liquid supply module 24 includes a spray generator 240. The mixture 60 from the storage tank 31 is transmitted to the spray generator 240 via an inlet conduit 241. The spray generator 240 converts the mixture 60 into a transformed state for facilitating the generation of a liquid spray. In some embodiments, the spray generator 240 includes an ultrasonic oscillator. The mixture 60 is converted to mist spray 61 by ultrasonic energy. Specifically, the ultrasonic oscillator reduces the mixture 60 to mass small drops. In some other embodiments, the spray generator 240 converts the mixture 60 into mist spray 61 using high-pressure air. The high-pressure air is ejected toward the mixture 60 to reduce the mixture 60 to mass small drops.

In some embodiments, the spray generator 240 is electrically connected to the controller 29. The controller 29 may control the power and/or frequency of the spray generator 240 for spray (or mist) generation control. In cases where the spray generator 240 is an ultrasonic oscillator, the power may be maintained within a range of about 10 W to about 500 W.

The liquid supply module 24 also includes a group of spray nozzles N. The number of the spray nozzles in the group of spray nozzles N may in a range from 1 to 20. For purpose of illustration, only three spray nozzles 261, 262 and 263 of the group of spray nozzles N are shown in FIG. 2.

In some embodiments, the spray nozzles 261, 262 and 263 are positioned on a platform 260 which is connected to the actuator assembly 212. The actuator assembly 212 may include a linear motor to move the platform 260 vertically along a direction as indicated by an arrow a2 shown in FIG. 2. Therefore, a distance H between the spray nozzles 261, 262 and 263 and the wafer stage 22 can be adjusted. The distance H between the spray nozzles 261, 262 and 263 and the wafer stage 22 may be in a range from about 5 cm to about 30 cm. However, it should be appreciated that many variations and modifications can be made to embodiments of the disclosure. In some other embodiments, the platform 260 is fixed in the chamber 21. In some other embodiments, the platform 260 is omitted, and the spray nozzles 261, 262 and 263 are positioned on a bottom wall of the chamber 21.

The spray nozzles 261, 262 and 263 may be made of Chlorinated polyvinyl chloride (CPVC), Ultra-high molecular Weight Polyethylene (UPE), Polytetrafluoroethylene (PTEE), Polyethylene terephthalate (PET), Polypropylene (PP), Polyaryletherketone (PEEK) or any other anti-corrosion material. The openings of the spray nozzles 261, 262 and 263 may have a width W1 in a range of about 1 mm to about 5 mm. The configuration of the spray nozzles 261, 262 and 263 can be modified according to a predetermined spray distribution. For example, the spray nozzles 261, 262 and 263 may be formed in fan type, cone type or fog type as shown in FIGS. 3A-3F.

Referring back to FIG. 2, in some other embodiments, the mixture 60 is converted to mist spray 61 by the spray nozzles 261, 262 and 263 instead of the spray generator 240. In this case, the spray generator 240 may include a pump, and the spray nozzles 261, 262 and 263 include a number of small holes allowing liquid passing. The generate the liquid spray, the mixture 60 is pressurized by the pump to form a high pressure of about 80-bar to about 150-bar, for example. Afterwards, the very small holes of the spray nozzles 261, 262 and 263 changes the mixture 60 into small drops when the mixture 60 flows through the spray nozzles 261, 262 and 263.

In some embodiments, at least one of the spray nozzles 261, 262 and 263 may be rotatable about an axis that is parallel with the platform 260 to allow mist spray to be discharged along a path inclined relative to a vertical direction. For example, the spray nozzles 261 and 263, which are used to discharge mist spray over an edge region of the semiconductor wafer 5, are rotatable. An inclined angle b of the spray nozzles 261 and 263 relative to the vertical direction may be in a range from about 30 degrees to about 150 degrees. The inclined angle b of the spray nozzles 261 and 263 may be dynamically changed during the discharge of the mist spray.

In some embodiments, the liquid supply module 24 further includes a tracking assembly 265. The tracking assembly 265 is configured to measure the distance between the spray nozzles 261, 262 and 263 and the wafer stage 22. In some embodiments, the tracking assembly 265 emits energy beam L1 such as laser, sonar, or microwave, to the wafer stage 22 (or the semiconductor wafer 5) with a signal source member (not shown) and receives a reflected energy beam L2 from the wafer stage 22 (or the semiconductor wafer 5) with a signal reception member. Afterwards, the tracking assembly 265 calculates the distance H between the pray nozzles 261, 262 and 263 and the wafer stage 22 by multiplying the velocity of the energy beam and the traveling time of the energy beam. As a result, the distance H is tracked before or during the spraying of the mist spray.

In some other embodiments, the tracking assembly 265 is also configured to detect the presence of the semiconductor wafer 5 on the wafer stage 22. Specifically, the tracking assembly 265 emits energy beam L1 to a gap (as more clearly shown in FIG. 4) between two extending blades 221 where the semiconductor wafer 5 is placed, and measures a traveling time of the energy beam after receiving the reflected energy beam L2. When the traveling time is less than a predetermined value, it means that the semiconductor wafer 5 is located over the wafer stage 22. Afterwards, the tracking assembly 265 sends a signal to the controller 29, and the controller 29 may send signals to other elements of the processing system 1 for other operations. For example, the controller 29 sends signal to the liquid supply module 24 for discharging the mist spray 61 over the semiconductor wafer 5.

As shown in FIG. 4, the group of spray nozzles N is arranged in an array when seen from the top view. However, it should be appreciated that many variations and modifications can be made to embodiments of the disclosure. In some other embodiments, as shown in FIG. 5, the group of spray nozzles N is arranged in a radial form, with the nozzle 262 being aligned with the semiconductor wafer 5 while the semiconductor wafer 5 is placed on the wafer stage 22.

In some embodiments, as shown in FIG. 4 or FIG. 5, the width W2 of a region R occupied by the group of spray nozzles N is sufficiently greater than a diameter of the semiconductor wafer 5. Therefore, when the semiconductor wafer 5 is placed on the wafer stage 22, a projection of the semiconductor wafer 5 is located on the region R occupied by the group of spray nozzles N.

In some embodiments, as shown in FIG. 4 or FIG. 5, an outer edge of the semiconductor wafer 5 which is placed on the wafer stage 22 is clamped by a number of fastening members 225, such as four. Therefore, a surface of the semiconductor wafer 5 that faces the group of spray nozzles N is not covered by the wafer stage 22, and the mist spray from the group of spray nozzles N can be discharged over the entire polished surface of the semiconductor wafer 5.

Referring back to FIG. 2, the spray nozzles 261, 262 and 263 are connected to the outlet conduit 242 via respective flow lines 271, 272 and 273. In some embodiments, the liquid supply module 24 also includes a number of flow regulating members 281, 282 and 283 connected to the flow lines 271, 272 and 273. The flow regulating members 281, 282 and 283 are configured to control the flow of the mist spray 61 in respective flow lines 271, 272 and 273. The flow regulating members 281, 282 and 283 may include liquid closed-loop control (CLC) flow meters. The flow regulating members 281, 282 and 283 are electrically connected to the controller 29 and regulate the flow of the mist spray 61 in response to the control signals from the controller 29.

In some embodiments, the liquid supply module 24 further includes a lateral spray nozzle 264. The lateral spray nozzle 264 is placed on the side wall 211 of the chamber 21 and located at a position that is higher than the wafer stage 22. The lateral spray nozzle 264 is placed in such a manner that the mist spray from the lateral spray nozzle 264 can be discharged over a polishing head 36 (which will described latter) and the semiconductor wafer 5 while the semiconductor wafer 5 is unloaded from the polishing head 36 and placed on the wafer stage 22.

In some embodiments, the lateral spray nozzle 264 is connected to the outlet conduit 242 via a flow line 274, and a flow regulating member 284 is connected to the flow line 274. The flow regulating member 284 is configured to control the flow of the mist spray 61 in the flow line 274. The flow regulating member 284 may include liquid CLC flow meters and is electrically connected to the controller 29 and regulate the flow of the mist spray 61 in response to the control signals from the controller 29.

In some embodiments, the heating module 25 is connected to the liquid supply module 24 to heat up the mist spray 61 from the spray generator 240. In some embodiments, the heating module 25 includes a heater and surrounds the outlet conduit 242. The mist spray 61 from the spray generator 240 is heated by the heating module 25 to a predetermined temperature. The predetermined temperature may be determined by the composition of the mist spray 61. In some embodiments, the mist spray 61 is heated to have temperature from about 25° C. to about 150° C.

Figure 6:
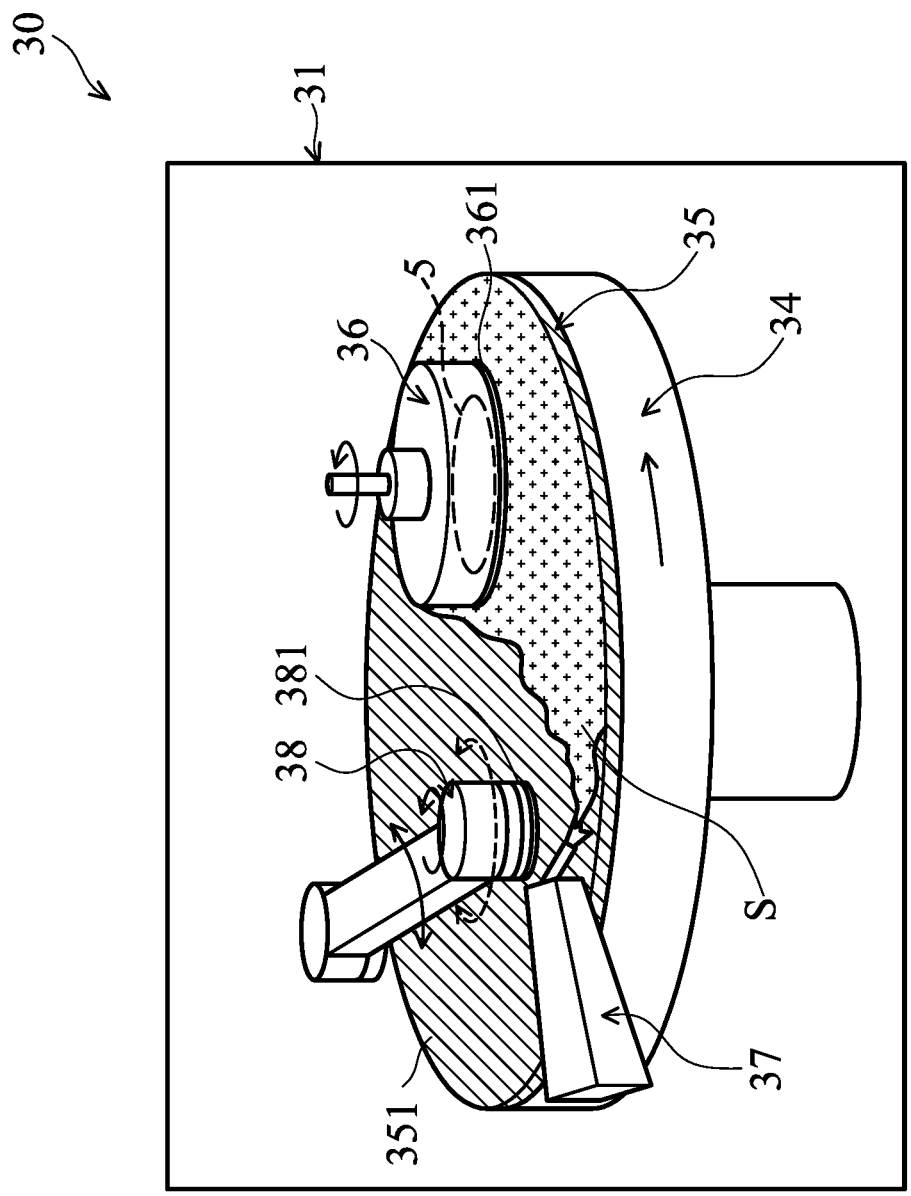
FIG. 6 shows a schematic view of a CMP tool, in accordance with some embodiments.

FIG. 6 shows a schematic view of the CMP 30 tool, in accordance with some embodiments. The CMP tool 30 is configured to perform a CMP process over the semiconductor wafer 5. The CMP tool 30 includes a processing chamber 31, a polishing platen 34, a polishing pad 35, a polishing head 36, a slurry dispenser 37, and a pad conditioner 38, in accordance with some embodiments.

The processing chamber 31 provides a sealed, contained system for the components of the CMP tool 30 as described below. The polishing pad 35 is formed of a material that is hard enough to allow the abrasive particles in the slurry S to mechanically polish the semiconductor wafer 5, which is placed under the polishing head 36, during the CMP process. On the other hand, the polishing pad 35 is also soft enough so that it does not substantially scratch the semiconductor wafer 5.

In accordance with some embodiments, the polishing pad 35 is attached to the polishing platen 34 by an adhesive film, adhesive, or glue, for example. During the CMP process, the polishing platen 34 is rotated by a mechanism, such as a shaft coupled a rotating motor (not shown), and hence the polishing pad 35 fixed thereon is also rotated along the polishing platen 34.

The polishing head 36 is configured to hold and move the semiconductor wafer 5 in various stages of the CMP process. For example, as the semiconductor wafer 5 to be polished is transferred into the processing chamber 31, the polishing head 36 is driven by a mechanism, such as a pivotable arm and a motor (not shown), to move over the semiconductor wafer 5. The semiconductor wafer 5 is then picked up by the polishing head 36.

In accordance with some embodiments, the polishing head 36 includes a plurality of air passages (not shown), in which a vacuum may be generated. By vacuuming the air passages, the semiconductor wafer 5 is sucked up and held on the bottom of the polishing head 36 for the transportation of the semiconductor wafer 5 to the polishing pad 35. After the polishing of the semiconductor wafer 5 on the polishing pad 35 is completed, the polished semiconductor wafer 5 is further moved by the polishing head 36 from the polishing pad 35 to be transferred out of the processing chamber 31.

During the CMP process, the polishing head 36 is also operable to provide a predetermined amount of pressure to press the semiconductor wafer 5 against the polishing pad 35 for mechanical polishing. For example, after the polishing head 36 is moved over and also pressed against the polishing pad 35, the vacuuming in the air passages is then turned off, and hence the semiconductor wafer 5 is no longer sucked up. Afterwards, a flexible membrane (not shown) disposed between the bottom of the polishing head 36 and the semiconductor wafer 5 is inflated, for example, by pumping air into zones in the flexible membrane, and hence the inflated flexible membrane presses the semiconductor wafer 5 against the polishing pad 35.

During the CMP process, the polishing head 36 is also rotated by a mechanism, such as a shaft coupled a rotating motor (not shown), causing the rotation of the semiconductor wafer 5 affixed to the polishing head 36. In accordance with some embodiments, the polishing head 36 and the polishing pad 35 rotate in the same direction (clockwise or counter-clockwise). In accordance with alternative embodiments, the polishing head 36 and the polishing pad 35 rotate in opposite directions. With the rotation of the polishing pad 35 and the polishing head 36, the slurry S flows between the semiconductor wafer 5 and the polishing pad 35 through surface grooves (not shown) formed on the polishing surface 351 of the polishing pad 35. Through the chemical reaction between the reactive chemicals in the slurry S and the top surface of the semiconductor wafer 5, and further through the mechanical polishing (i.e. through contact and friction between the top surface of the semiconductor wafer 5 and the polishing surface 351), the top surface of the semiconductor wafer 5 is planarized.

A circular retaining ring 361 is provided along the periphery of the bottom of the polishing head 36 and will be pressed against the polishing surface 351 during the CMP process. The retaining ring 361 is used to retain the semiconductor wafer 5) in case the semiconductor wafer 5 becomes offset from the central axis of the polishing head 36, so that the semiconductor wafer 5 is not spun off from the polishing pad 35 during the polishing process. In accordance with some embodiments, the retaining ring 361 comprises a wear-resistant material, which may be plastic, ceramic, polymer, etc. For example, the retaining ring 361 is formed of polyphenylene sulfide (PPS), polyetheretherketone (PEEK), or a mix of these materials and other materials such as polymers (for example, polyurethane, polyester, polyether, or polycarbonate).

The slurry dispenser 37 is operable to dispense slurry S onto the polishing pad 35 during the CMP process. The slurry S includes reactive chemicals that can react with the top surface of the semiconductor wafer 5. Furthermore, the slurry S includes abrasive particles for mechanically polishing the semiconductor wafer 5. In accordance with some embodiments, the slurry dispenser 37 is coupled to a reservoir (not shown) that holds a supply of the slurry S. Moreover, the slurry dispenser 37 comprises a nozzle for dispensing the slurry S and a pivotable arm coupled to the nozzle. The pivotable arm is driven by a mechanism, such as a motor (not shown), and hence the slurry dispenser 37 can be moved towards the polishing pad 35 during the CMP process and away from the polishing pad 35 after the CMP process.

The pad conditioner 38 is configured and operable to perform a conditioning process to remove polished debris and undesirable by-products from the polishing surface 351 of the polishing pad 35 during the CMP process. In accordance with some embodiments, the pad conditioner 38 includes a conditioning disk 381 including embedded or encapsulated cut diamond particles on a substrate. The conditioning disk 381 comes into contact with the polishing surface 351 (for performing the conditioning process) when the polishing pad 35 is to be conditioned, for example, during the polishing process as previously discussed or after the polishing process.

During the conditioning process, both the polishing pad 35 and the conditioning disk 381 rotate, and the conditioning disk 381 also sweeps back and forth across the polishing surface 351, so that the protrusions or cutting edges of the conditioning disk 381 move relative to the polishing surface 351, thereby removing polished debris and undesirable by-products from the polishing surface 351 and re-opening the surface grooves on the polishing surface 351 (i.e. re-texturizing the polishing surface 351). Consequently, the cleanliness of the polishing surface 351 is maintained and the lifetime of the polishing pad 35 is prolonged.

Referring back to FIG. 1, in some embodiments, the semiconductor wafer 5 to be polished is transferred from the interface tool 20 to the CMP tool 30. After the CMP process is finished, the semiconductor wafer 5 is sent back to the interface tool 20 again, and the semiconductor wafer 5 is transferred to the cleaning tool 40 for a cleaning process. However, it should be appreciated that many variations and modifications can be made to embodiments of the disclosure.

In some other embodiments, there are two CMP tools 30 and 30a used to process the semiconductor wafer 5 in two stages. Specifically, the semiconductor wafer 5 from the interface tool 20 is processed by the CMP tool 30a for a first-stage CMP process and sent back to the interface tool 20. Afterwards, the semiconductor wafer 5 is transferred to the CMP tool 30 for a second-stage CMP process. After the second-stage CMP process is finished, the semiconductor wafer 5 is sent back to the interface tool 20 again, and the interface tool 20 transfers the semiconductor wafer 5 to the cleaning tool 40 for a cleaning process.

Alternatively, the semiconductor wafer 5 from the interface tool 20 is continuously processed by the CMP tools 30 and 30a and will not to be sent back to the interface tool 20 before the two stages CMP process are finished. In this case, the semiconductor wafer 5 may be held by the same polishing head during the two-stage CMP process.

The cleaning tool 40 is configured to perform a post-CMP cleaning process to remove all polishing slurry, polishing residues in a quick and repeatable fashion. The semiconductor wafer 5 may be transferred from the interface tool 20 to the cleaning tool 40 by a transporter (not shown in figures). The semiconductor wafer 5 is cleaned by a cleaning liquid, such as deionized water (DIW) and is dried. The semiconductor wafer 5 cleaned by the cleaning tool 40 is then transferred to the carrier 8 via the transferring tool 10.

Figure 7:
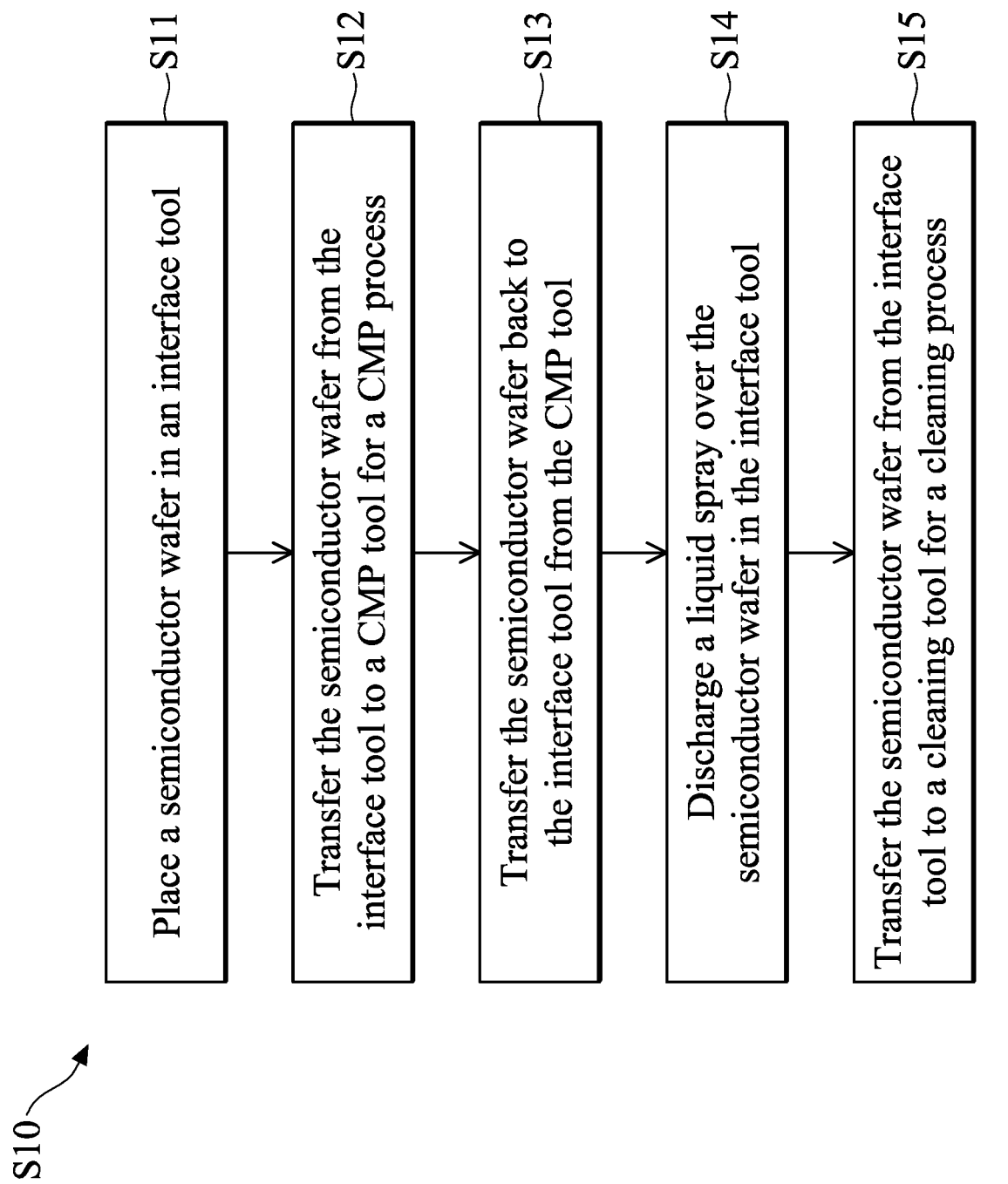
FIG. 7 shows a flow chart of a method for processing a semiconductor wafer with the processing system, in accordance with some embodiments.

FIG. 7 shows a flow chart of a method for processing a semiconductor wafer 5 with the processing system 1, in accordance with some embodiments. For illustration, the flow chart of FIG. 7 will be described along with the schematic views shown in FIGS. 1 and 8-10. Some of the stages described can be replaced or eliminated for different embodiments.

The method S10 includes operation S11, in which the semiconductor wafer 5 is placed in the interface tool 20. In some embodiments, as shown in FIG. 1, the semiconductor wafer 5 is transferred to the interface tool 20 from the transferring tool 10. The transferring tool 10 may further includes an inversing robot (not shown in figures). The inversing robot receives the semiconductor wafer 5 before polishing from the transporter 15, and turns the semiconductor wafer 5 upside down and delivers the wafer to the wafer stage 22 of the interface tool 20.

The method S10 also includes operation S12, in which the semiconductor wafer 5 is transferred to the CMP tool 30 from the interface tool 20 for a CMP process. In some embodiments, before the semiconductor wafer 5 is transferred to the CMP tool 30, the mist spray 61 is discharged from the group of nozzle N below the semiconductor wafer 5, so as to rinse the semiconductor wafer 5 before the CMP process. However, it should be appreciated that many variations and modifications can be made to embodiments of the disclosure. In some other embodiments, no mist spray 61 is discharged over the semiconductor wafer 5 before the CMP process. The semiconductor wafer 5 may be removed from the interface tool 20 by the polishing head 36 of the CMP tool 30.

Figure 8:
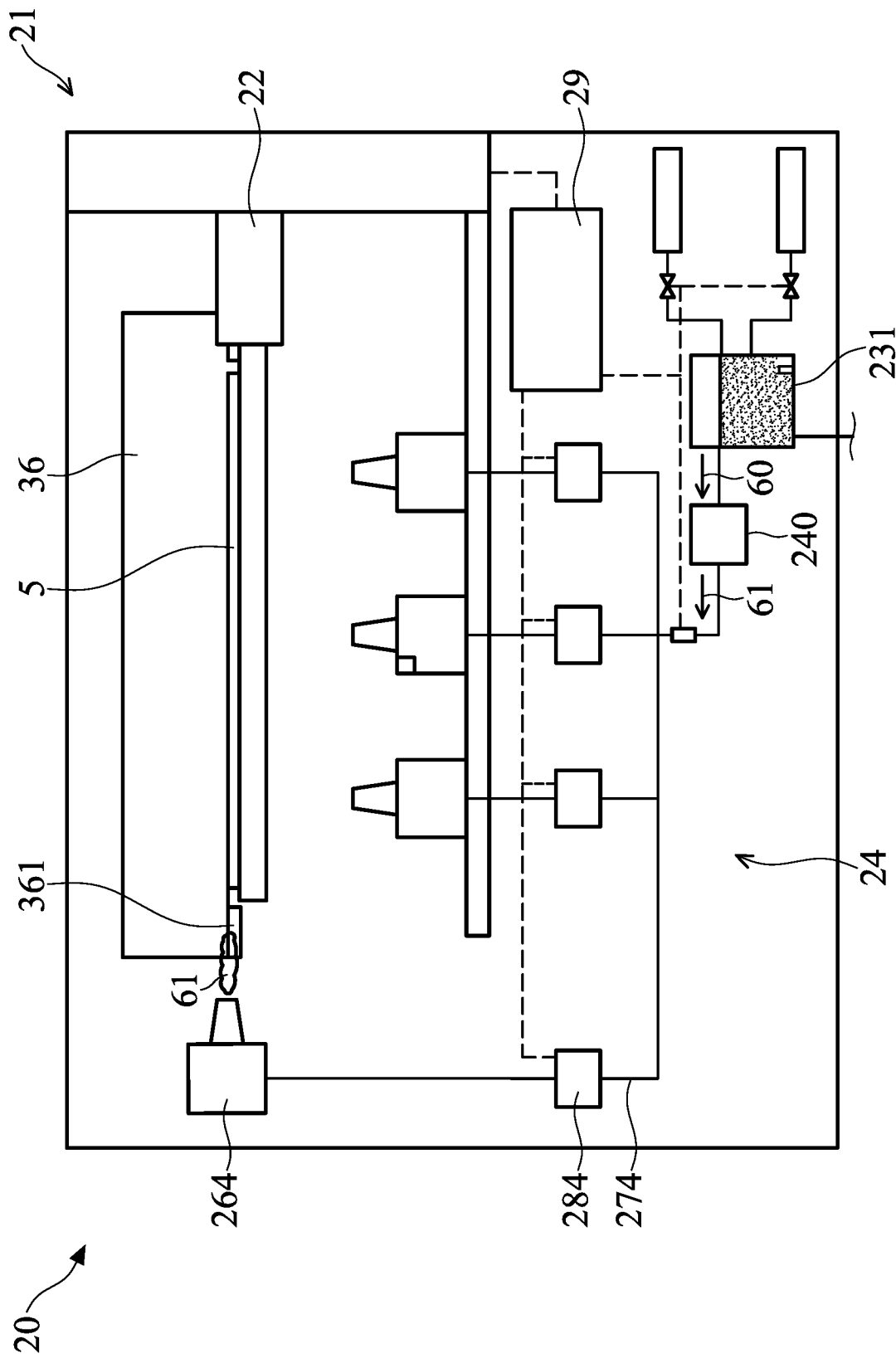
FIG. 8 shows a schematic view of one stage of a method for processing a semiconductor wafer in which mist spray is supplied in a lateral direction, in accordance with some embodiments.

After the CMP process is finished, the method S10 continues with operation S13, in which the semiconductor wafer 5 is transferred from the CMP tool 30 or CMP tool 30a to the interface tool 20. In some embodiments, as shown in FIG. 8, the semiconductor wafer 5 processed by the CMP tool 30 is transferred to the interface tool 20 by the polishing head 36. The semiconductor wafer 5 may be secured on the polishing head 36 by vacuum.

In some embodiments, to release the semiconductor wafer 5 from the polishing head 36, the vacuum for securing the semiconductor wafer 5 on the polishing head 36 is dismissed, and an air flow may be created by the polishing head 36 to apply a force on the semiconductor wafer 5 toward the wafer stage 22. While at the same time, as shown in FIG. 8, a mist spray 61 is discharged over the retaining ring 361 and the semiconductor wafer 5 from the spray nozzle 264. The mist spray 61 may include DIW, and the flow rate of the mist spray 61 is controlled by the liquid regulating member 284.

With the mist spray 61, the semiconductor wafer 5 can be easily unloaded from the polishing head 36 and stably placed on the wafer stage 22. The vacant polishing head 36 is then removed from the chamber 21, and used to pick up another semiconductor wafer 5 held by another wafer stage (not shown in FIG. 8) of the interface tool 20 which is going to be processed by the CMP tool 30.

In some embodiments, the supply of the mist spray 61 from the spray nozzle 264 is initiated when the semiconductor wafer 5 held by the polishing head 36 is in contact with the wafer stage 22, and the mist spray 61 is supplied for a predetermined time period. In some embodiments, the supply of the mist spray 61 from the spray nozzle 264 is initiated when the polishing head 36 is moved into the chamber 21 and is not stopped until the polishing head 36 is removed from the chamber 21.

Figure 9:
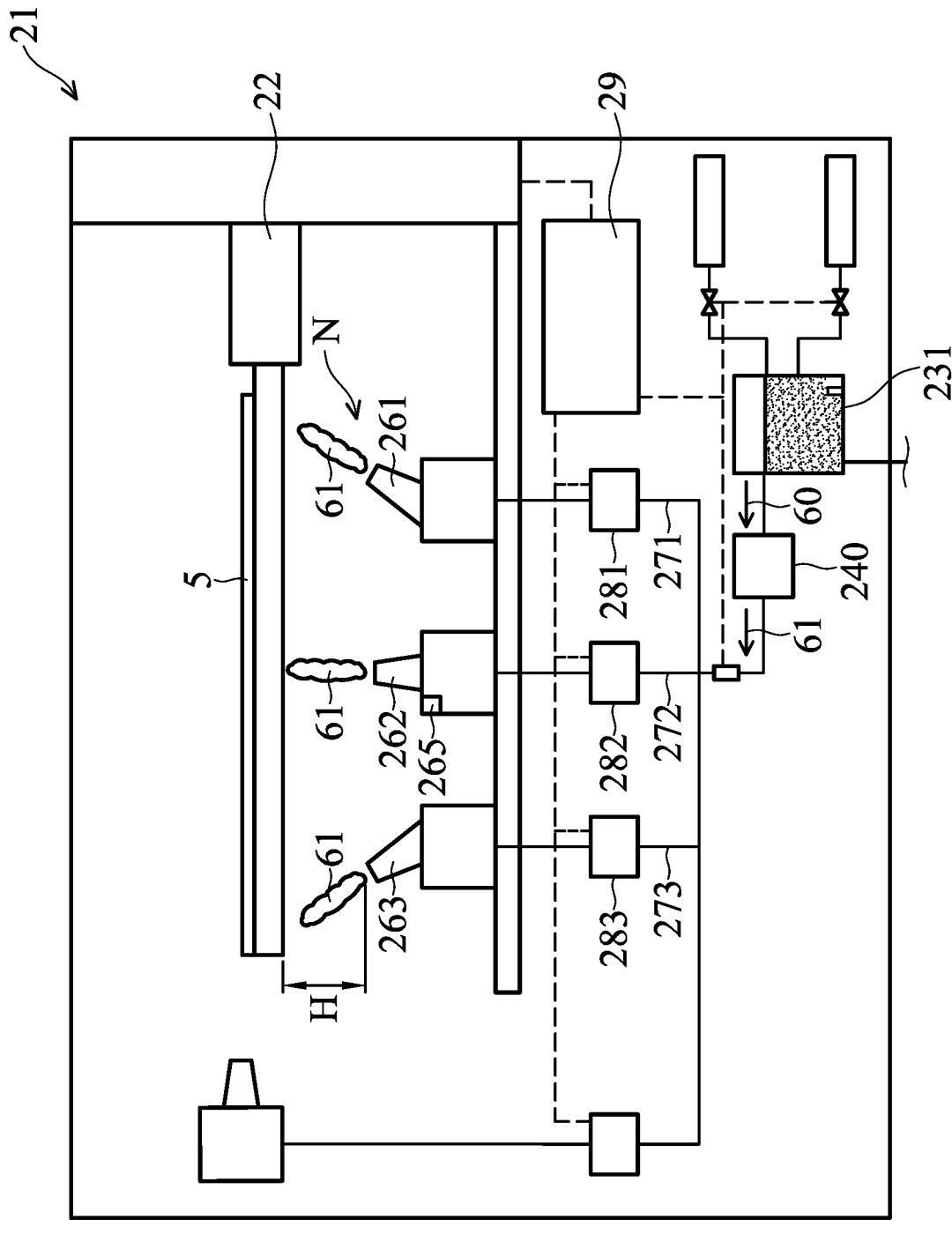
FIG. 9 shows a schematic view of one stage of a method for processing a semiconductor wafer in which mist spray is supplied below the semiconductor wafer, in accordance with some embodiments.

The method S10 also includes operation S14, in which the mist spray 61 is sprayed over the semiconductor wafer 5 by the group of nozzles N below the semiconductor wafer 5 while the semiconductor wafer 5 is stayed in the interface tool 20, as shown in FIG. 9.

In some embodiments, the flow rate of the mist spray 61 supplied from each of the spray nozzles 261, 262 and 263 is controlled by the respective liquid regulating members 681, 682 and 683. The flow rate of the mist spray 61 supplied from each of the spray nozzles 261, 262 and 263 may be in a range from about 50 sccm to about 2000 sccm. The liquid regulating member 681, 682 and 683 may provide a consistent flow rate with an error of approximately ±1% to ±5~10%.

In some embodiments, the controller 29 independently controls the flow of the mist spray 61 in each of the flow lines 271, 272 and 273. Therefore, the mist spray 61 discharged from one of the spray nozzles may have a different flow rate than the mist spray discharged from another of the spray nozzles. For example, the spray nozzles 261 and 263 may discharge the mist spray 61 at a first flow rate, and the mist spray 61 discharged from the spray nozzle 262 has a second flow rate. The second flow rate may be less than the first flow rate. However, it should be appreciated that many variations and modifications can be made to embodiments of the disclosure. In some other embodiments, the second flow rate is the same as the first flow rate.

In some embodiments, the flow rates of the mist spray of different spray nozzles are determined according to a historical data associated a map of defects formed on the semiconductor wafers which is processed by the same CMP process. For example, some regions of the semiconductor wafer tend to be eroded are subjected with mist spray having higher flow rate, so as to improve the yield of the semiconductor wafer 5.

The time period for discharging the mist spray 61 may be in a range from about 0.1 seconds to about 60 seconds. In some embodiments, the discharge of the mist spray 61 is initiated once the tracking member 265 detects the semiconductor wafer 5 is placed on the wafer stage 22. In some other embodiments, the mist spray 61 is discharged over the semiconductor wafer 5 after a predetermined period of time following the detection of the presence of the semiconductor wafer 5 on the wafer stage 22. The predetermined period may be greater than about 0 second but less than about 20 sec.

In some embodiments, operation S14 is repeated multiple times before the semiconductor wafer 5 is removed from the interface tool 20. For example, the discharge of the mist spray 61 is paused after a predetermined time period for performing operation S14 elapses. Afterwards, the interface tool 20 starts counting the time after the end of operation S14. If the counted time is greater than a preset idle time, it means the semiconductor wafer 5 is not removed from the interface tool 20 as processing parameter, and the operation S14 is repeated. Therefore, a defect of the semiconductor wafer 5 resulting from too long a wait time for the CMP tool 30 or the cleaning tool 40 to become available can be avoided.

In some embodiments, the mist spray 61 provided by at least one of the spray nozzles 261, 262 and 263 is ejected substantially along a path that is inclined relative to a vertical direction. For example, as shown in FIG. 9, the mist spray 61 provided by the spray nozzles 261 and 263 is discharged along paths inclined relative to a vertical direction.

By contrast, the mist spray 61 provided by the spray nozzle 262 is discharged along a path that is parallel with a vertical direction. In some embodiments, the inclined angle of the spray nozzles 261 and 263 relative to the vertical direction is be dynamically changed during the discharge of the mist spray. In some other embodiments, the inclined angle of the spray nozzles 261 and 263 is adjusted before the discharge of the mist spray from the spray nozzles 261, 262 and 263.

In some embodiments, after operation S13 and before operation S14, the distance between the spray nozzles 261, 262 and 263 and the wafer stage 22 is adjusted. For example, the distance H between the spray nozzles 261, 262 and 263 and the wafer stage 22 (or the semiconductor wafer 5) is adjusted according to the measured distance transmitted from the tracking assembly 265. Therefore, the mist spray 61 can be supplied over the semiconductor wafer 5 with a predetermined distribution.

In the cases where CMP processes are performed in two stages, the semiconductor wafer 5 may be moved to the interface tool 20 during the intermission of the two stages. Operation S14 may be performed during this intermission, so as to rinse the semiconductor wafer 5 before the following CMP process or protect a material which is exposed in the previous CMP process. However, it should be appreciated that many variations and modifications can be made to embodiments of the disclosure. In some other embodiments, no mist spray 61 is discharged over the semiconductor wafer 5 between the two CMP processes.

Figure 10:
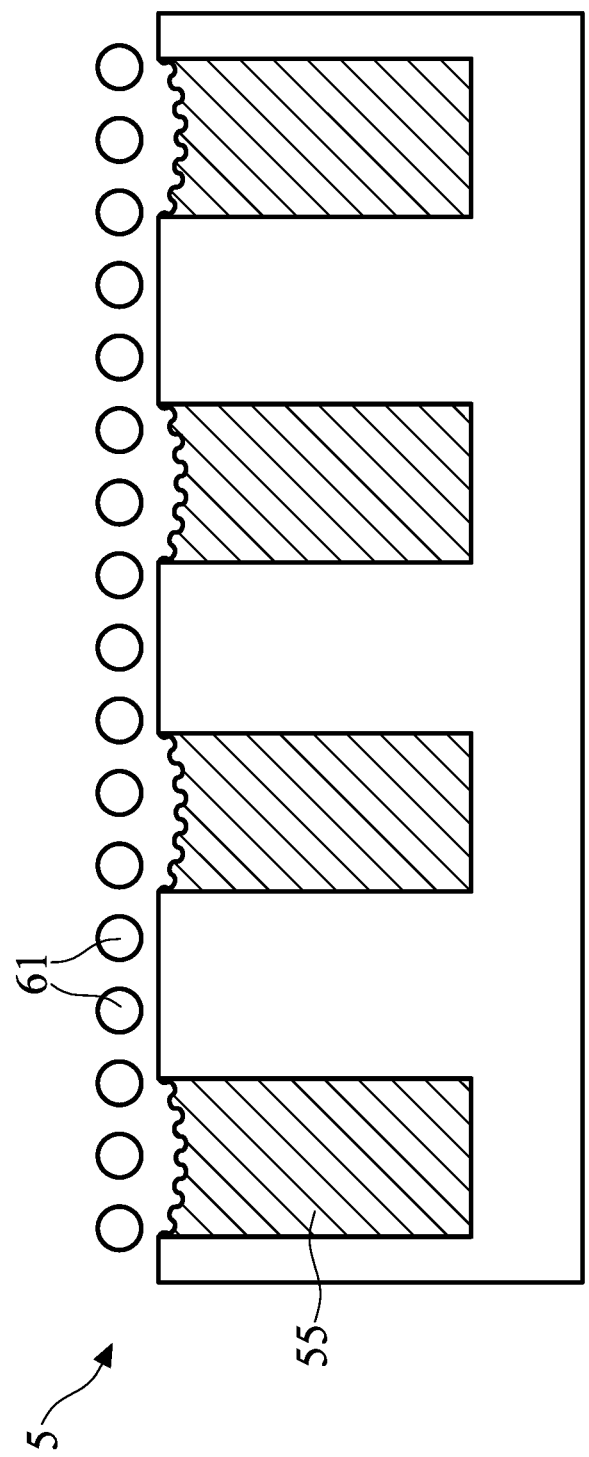
FIG. 10 shows a cross-sectional view of a semiconductor wafer covered by mist spray, in accordance with some embodiments.

In some embodiments, a composition of the mist spray used in operation S14 may be different from that used in operation S12 or the above-mentioned intermission. For example, as shown in FIG. 10, after the semiconductor wafer 5 is polished, Co recesses 55 are exposed. In order to avoid corrosion of cobalt recesses 55, the mist spray 61 may include $NH_4OH$ solution having concentration of 100 ppm. By contrast, a composition of the mist spray used in operation S12 includes DIW or slurry used in CMP process which may improve efficiency for the CMP process.

The method S10 also includes operation S15, in which the semiconductor wafer 5 is transferred from the wafer stage 22 of interface tool 20 to the cleaning tool 30 for a cleaning process. In some embodiments, the semiconductor wafer 5 is transferred from the wafer stage 22 to the cleaning tool 30 via a robotic arm (not shown in figures). In the cleaning process, the polishing slurry, polishing residues and the mist spray is removed by cleaning liquid in order to prevent introduction of defects into the polished product. After the cleaning process, the semiconductor wafer is dried and transferred to the carrier 8 via the transfer tool 10.

Figure 11:
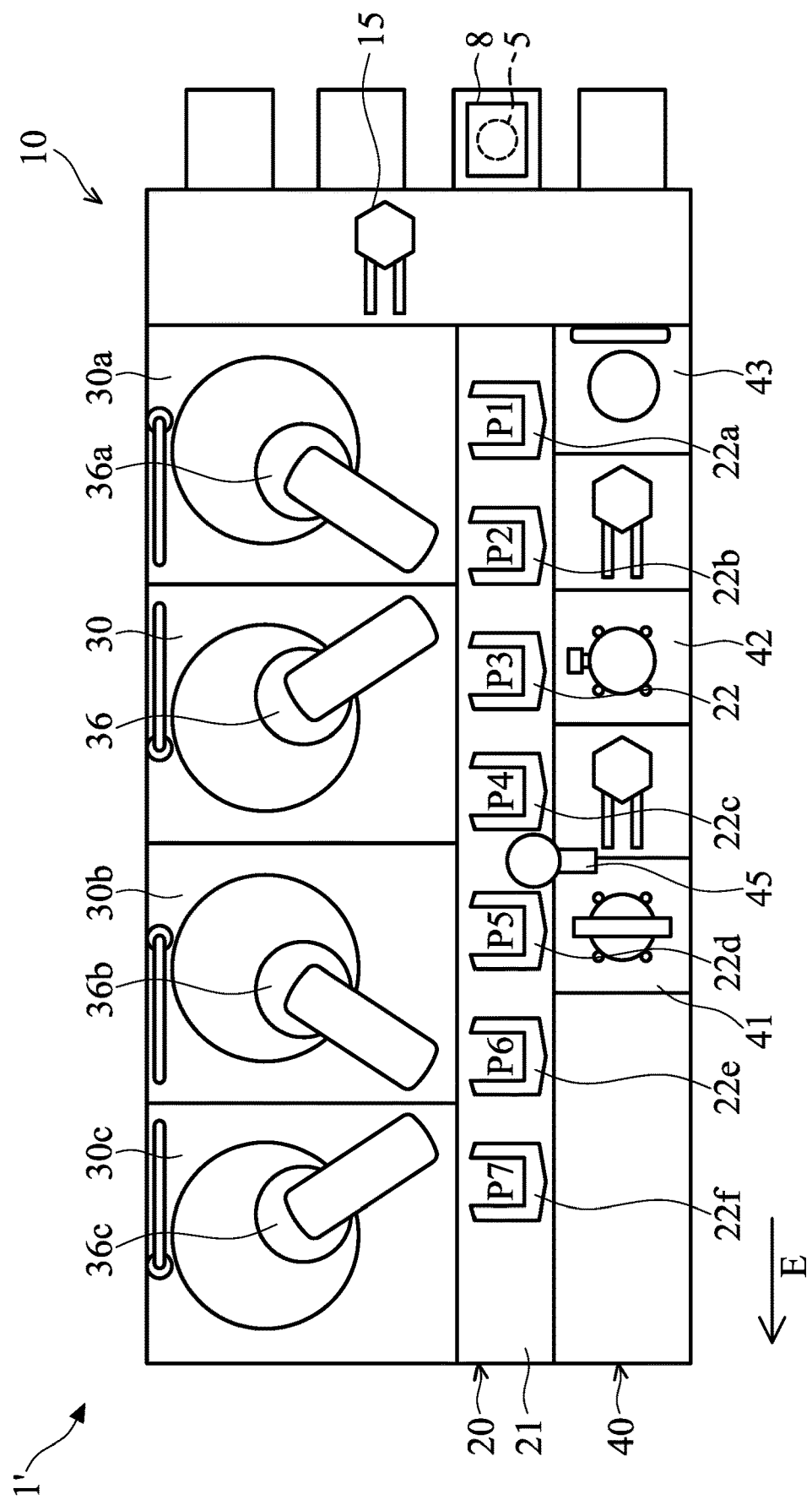
FIG. 11 shows a schematic view of a processing system in semiconductor fabrication, in accordance with some embodiments.

FIG. 11 shows a schematic view of a processing system 1', in accordance with some embodiments. In the embodiments shown in FIG. 11, elements that are similar to those shown in FIGS. 1-2 are provided with the same reference numbers, and the features thereof are not reiterated in the interests of brevity.

In some embodiments, the processing system 1' includes four CMP tools 30a, 30, 30b and 30c. The four CMP tools 30a, 30, 30b and 30c are positioned at one side of the chamber 21 and arranged along an extension direction E of the chamber 21 in order. The cleaning tool 40 of the processing system 1' further includes three cleaning modules 41, 42 and 43 arranged along the extension direction E of the chamber 21 in order.

In addition, the interface tool 20 includes a number of wafer stages, such as wafer stages 22a, 22b, 22, 22c, 22d, 22e and 22f. The wafer stages 22a, 22b, 22, 22c, 22d, 22e and 22f are positioned in the chamber 21 and arranged along the extension direction E of the chamber 21. The wafer stages 22d and 22f are positioned at a height that is different from that the wafer stages 22a, 22b, 22, 22d and 22e are located. As a result, the wafer stages 22a, 22b, 22, 22d and 22e and the wafer stage 22d and 22f can move freely in the extension direction E without interfering with each other.

In some embodiments, the wafer stages 22a, 22b, and 22 are configured to support the semiconductor wafer 5 which is going to be processed by the CMP tools 30 and 30a. Specifically, the wafer stage 22a transports a wafer between a first transport position P1 and a second transport position P2. The semiconductor wafer 5 is placed at the first transport position P1 when the semiconductor wafer 5 is just transferred from the transferring tool 10. The semiconductor wafer 5 is picked up and unloaded by a polishing head 36a of the CMP tool 30a at the second transport position P2.

The wafer stage 22b transports a wafer between the second transport position P2 and a third transport position P3. The semiconductor wafer 5 is picked up and unloaded by the polishing head 36 of the CMP tool 30 at the third transport position P3. The wafer stage 22 transports a wafer between the third transport position P3 and a fourth transport position P4. At the fourth transport position P4, the semiconductor wafer 5 is transferred from to the cleaning tool 40 or the wafer stages 22d by a transporter 45, such as robotic arm.

In addition, the wafer stage 22c shuttles the semiconductor wafer 5 from the transferring tool 10 to the fourth transport position P4, and the wafer stages 22d, 22e, and 22f are configured to support the semiconductor wafer 5 which is going to be processed by the CMP tools 30b and 30c. Specifically, the wafer stage 22d transports a wafer between a fifth transport position P5 and a sixth transport position P6. The semiconductor wafer 5 is placed at the fifth transport position P5 when the semiconductor wafer 5 is transferred from fourth transport position P4 by the transporter 45. The semiconductor wafer 5 is picked up and unloaded by a polishing head 36b of the CMP tool 30b at the sixth transport position P6.

The wafer stage 22e transports a wafer between the sixth transport position P6 and a seventh transport position P7. The semiconductor wafer 5 is picked up and unloaded by a polishing head 36c of the CMP tool 30c at the third transport position P7. The wafer stage 22f transports a wafer between the seventh transport position P7 and the fifth transport position P5.

In some embodiments, the semiconductor wafer 5 is transferred in the processing system 1' in the following sequence:

Route 1: carrier 8, transporter 15, wafer stage 22a, polishing head 36a, wafer stage 22b, polishing head 36, wafer stage 22, transporter 45, cleaning module 41, cleaning module 42, cleaning module 43, transporter 15 and carrier 8.

Route 2: carrier 8, transporter 15, wafer stage 22c, transporter 45, wafer stage 22d, polishing head 36b, wafer stage 22e, polishing head 36c, wafer stage 22f, transporter 45, cleaning module 41, cleaning module 42, cleaning module 43, transporter 15 and carrier 8.

Route 3: carrier 8, transporter 15, wafer stage 22a, polishing head 36a, wafer stage 22b, polishing head 36, wafer stage 22, transporter 45, wafer stage 22d, polishing head 36b, wafer stage 22e, polishing head 36c, wafer stage 22f, transporter 45, cleaning module 41, cleaning module 42, cleaning module 43, transporter 15 and carrier 8.

Route 4: carrier 8, transporter 15, wafer stage 22b, polishing head 36, wafer stage 22, transporter 45, cleaning module 41, cleaning module 42, cleaning module 43, transporter 15 and carrier 8.

Route 5: carrier 8, transporter 15, wafer stage 22c, transporter 45, wafer stage 22e, polishing head 36c, wafer stage 22f, transporter 45, cleaning module 41, cleaning module 42, cleaning module 43, transporter 15 and carrier 8.

In some embodiments, there is one liquid supply unit 24 (not shown in FIG. 11) positioned at each of transport positions P4 and P5, so as to provide mist spray over the semiconductor wafer 5 when the semiconductor wafer 5 is moved to these two transport positions P4 and P5. In some embodiments, there is one liquid supply unit 24 (not shown in FIG. 11) positioned at each of the transport positions P1-P7, so as to provide mist spray over the semiconductor wafer 5 when the semiconductor wafer 5 is moved to these transport positions P1-P7. The composition of mist spray supplied from the liquid supply units 24 at the transport positions P1-P7 may be different. In addition, the liquid supply units 24 at the transport positions P1-P7 may be operated with different parameters.

In some embodiments, the wafer stage 22 receives the semiconductor wafer 5 unloaded from the polishing head 36 at the third transport position P3, and moves the semiconductor wafer 5 to the fourth transport position P4 to wait for the transporter 45 for transfer. Two groups of spray nozzles N are positioned at both the third transport position P3 and the fourth transport position P4, and the mist spray 61 is supplied over the semiconductor wafer 5 at the third transport position P3 and the fourth transport position P4. In some other embodiments, there is no spray nozzles positioned at the third transport position P3, and the discharge of the mist spray 61 after the CMP process is initiated when the semiconductor wafer 5 is moved to the fourth transport position P4.

Embodiments of method and processing system for performing CMP process use a liquid supply module to supply fine mist spray over the semiconductor wafer during the wait time for the transfer in the processing system. Since the semiconductor wafer is kept being rinsed after CMP process, defects due to condensed slurry formed on the semiconductor wafer can be mitigated or avoided. In addition, by selecting suitable composition of the mist spray and controlling the temperature of the mist spray, the exposed material layer in the CMP process is properly protected. As a result, a corrosion of the material layer can also be prevented or minimized.

In accordance with some embodiments, a system for performing a chemical mechanical polishing (CMP) process is provided. The system includes a CMP tool configured to polish a semiconductor wafer. The processing system further includes a wafer stage configured to support the semiconductor wafer for facilitating the insertion of the semiconductor wafer into, and its subsequent removal from, the CMP tool. The processing system also includes a number of spray nozzles positioned relative to the wafer stage. In addition, the processing system includes a spray generator connected to the spray nozzles and configured to convert a mixture to a mist spray. The processing system further includes a controller configured to activate flow of the mist spray from the spray generator to the spray nozzles to discharge the mist spray over the semiconductor wafer supported by the wafer stage.

In accordance with some embodiments, A processing system for performing a chemical mechanical polishing (CMP) process is provided. The system includes a CMP tool configured to polish a semiconductor wafer and an interface tool. The interface tool includes a wafer stage configured to support the semiconductor wafer for facilitating the insertion of the semiconductor wafer into, and its subsequent removal from, the CMP tool. The interface tool also includes a plurality of spray nozzles positioned relative to the wafer stage. In addition, the interface tool includes a spray generator connected to the spray nozzles and configured to convert a mixture to a mist spray. Moreover, the interface tool includes a controller configured to activate flow of the mist spray from the spray generator to the spray nozzles to discharge the mist spray over the semiconductor wafer supported by the wafer stage in the interface tool.

In accordance with some embodiments, a processing system for performing a chemical mechanical polishing (CMP) process is provided. The system includes at least two CMP tools, configured to polish a semiconductor wafer, wherein the two CMP tools are arranged along an extension direction and at least two interface tool. The two interface tools are arranged along the extension direction, and each of the interface tools includes a wafer stage configured to support the semiconductor wafer for facilitating the insertion of the semiconductor wafer into, and its subsequent removal from, the CMP tool. In addition, the interface tool includes a plurality of spray nozzles positioned relative to the wafer stage. The interface tool further includes a spray generator connected to the spray nozzles and configured to convert a mixture to a mist spray. In addition, the interface tool includes a controller configured to activate flow of the mist spray from the spray generator to the spray nozzles to discharge the mist spray over the semiconductor wafer supported by the wafer stage in the interface tool.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A processing system for performing a chemical mechanical polishing (CMP) process, the system comprising:
    a CMP tool configured to polish a semiconductor wafer in a processing chamber of the CMP tool;
    a wafer stage configured to support the semiconductor wafer in a chamber different from the processing chamber for facilitating the insertion of the semiconductor wafer into, and its subsequent removal from, the CMP tool, wherein no polishing process is performed on the semiconductor wafer supported on the wafer stage;
    a plurality of spray nozzles positioned in the chamber and relative to the wafer stage;
    a spray generator fluidly connected to the spray nozzles via flow lines and configured to convert a mixture to a mist spray, wherein the spray generator includes an ultrasonic oscillator; and
    a controller configured to activate flow of the mist spray from the spray generator to the spray nozzles to discharge the mist spray over the semiconductor wafer supported by the wafer stage;
    wherein the spray nozzles are arranged in a two-dimension array or a radial pattern;
    wherein at least one of the spray nozzles is rotatable relative to a platform on which the spray nozzles are positioned to allow the mist spray to be discharged along a path inclined relative to a vertical direction.

2. The processing system as claimed in claim 1, further comprising:
    a plurality of flow regulating members connected to the flow lines and configured to regulate flow of the mist spray from the spray generator to the spray nozzles, wherein the flow regulating members include liquid closed-loop control (CLC) flow meters;
    wherein the controller independently controls the flow regulating members so that the mist spray discharged from one of the spray nozzles has a different flow rate than the mist spray discharged from another of the spray nozzles.

3. The processing system as claimed in claim 1, wherein the wafer stage is movable between two transport positions; wherein the spray nozzles are positioned at the two transport positions.

4. The processing system as claimed in claim 1, wherein the mist spray comprises NH4OH solution or benzotriazole (BTA) solution.

5. The processing system as claimed in claim 1, wherein the spray nozzles are disposed under the bottom of the semiconductor wafer, and two of the spray nozzles are configured to discharging the mist spray at different angles relative to the semiconductor wafer.

6. The processing system as claimed in claim 1, wherein the processing system further comprises a tracking assembly configured to detect the presence of the semiconductor wafer,
    wherein the tracking assembly includes:
        a light emitter, configured to emits an energy beam to the wafer stage; and
        a light receiver, configured to receive a reflected energy beam from the wafer stage.

7. The processing system as claimed in claim 1, further comprising a lateral spray nozzle, located at a position that is higher than the wafer stage.

8. A processing system for performing a chemical mechanical polishing (CMP) process, the system comprising:
    a CMP tool configured to polish a semiconductor wafer; and
    an interface tool, different from and adjacent to the CMP tool, and the interface tool comprising:
        a wafer stage configured to support the semiconductor wafer for facilitating the insertion of the semiconductor wafer into, and its subsequent removal from, the CMP tool, wherein no polishing process is performed on the semiconductor wafer supported on the wafer stage;

a plurality of spray nozzles positioned relative to the wafer stage;

a spray generator fluidly connected to the spray nozzles via flow lines and configured to convert a mixture to a mist spray, wherein the spray generator includes an ultrasonic oscillator; and a controller configured to activate flow of the mist spray from the spray generator to the spray nozzles to discharge the mist spray over the semiconductor wafer supported by the wafer stage in the interface tool;

wherein at least one of the spray nozzles is rotatable relative to a platform on which the spray nozzles are positioned to allow the mist spray to be discharged along a path inclined relative to a vertical direction.

9. The processing system as claimed in claim 8, wherein the spray nozzles are arranged in an array or a radial pattern.

10. The processing system as claimed in claim 8, further comprising:

a plurality of flow regulating members connected to the flow lines and configured to regulate flow of the mist spray from the spray generator to the spray nozzles, wherein the flow regulating members include liquid closed-loop control (CLC) flow meters;

wherein the controller independently controls the flow regulating members so that the mist spray discharged from one of the spray nozzles has a different flow rate than the mist spray discharged from another of the spray nozzles.

11. The processing system as claimed in claim 8, wherein the wafer stage is movable between two transport positions;

wherein the spray nozzles are positioned at the two transport positions.

12. The processing system as claimed in claim 8, wherein the mist spray comprises NH4OH solution or benzotriazole (BTA) solution.

13. The processing system as claimed in claim 8, wherein the spray nozzles are disposed under the bottom of the semiconductor wafer, and two of the spray nozzles are configured to discharging the mist spray at different angles relative to the semiconductor wafer.

14. The processing system as claimed in claim 8, wherein the processing system further comprises a tracking assembly configured to detect the presence of the semiconductor wafer, wherein the tracking assembly includes:

a light emitter, configured to emits an energy beam to the wafer stage; and a light receiver, configured to receive a reflected energy beam from the wafer stage.

15. A processing system for performing a chemical mechanical polishing (CMP) process, the system comprising:

at least two CMP tools, configured to polish a semiconductor wafer, wherein the two CMP tools are arranged along an extension direction; and at least two interface tools, wherein the two interface tools are arranged along the extension direction, the interface tools are different from and adjacent to the CMP tool, and each of the interface tools comprises:

a wafer stage configured to support the semiconductor wafer for facilitating the insertion of the semiconductor wafer into, and its subsequent removal from, the CMP tool, wherein no polishing process is performed on the semiconductor wafer supported on the wafer stage;

a plurality of spray nozzles positioned relative to the wafer stage;

a spray generator fluidly connected to the spray nozzles via flow lines and configured to convert a mixture to a mist spray, wherein the spray generator includes an ultrasonic oscillator; and a controller configured to activate flow of the mist spray from the spray generator to the spray nozzles to discharge the mist spray over the semiconductor wafer supported by the wafer stage in the interface tool;

wherein at least one of the spray nozzles is rotatable relative to a platform on which the spray nozzles are positioned to allow the mist spray to be discharged along a path inclined relative to a vertical direction.

16. The processing system as claimed in claim 15, wherein the spray nozzles are arranged in an array or a radial pattern.

17. The processing system as claimed in claim 15, further comprising:

a plurality of flow regulating members connected to the flow lines and configured to regulate flow of the mist spray from the spray generator to the spray nozzles, wherein the flow regulating members include liquid closed-loop control (CLC) flow meters;

wherein the controller independently controls the flow regulating members so that the mist spray discharged from one of the spray nozzles has a different flow rate than the mist spray discharged from another of the spray nozzles.

18. The processing system as claimed in claim 15, wherein the wafer stage is movable between two transport positions;

wherein the spray nozzles are positioned at the two transport positions.

19. The processing system as claimed in claim 15, wherein the mist spray comprises NH4OH solution or benzotriazole (BTA) solution.

20. The processing system as claimed in claim 15, wherein the spray nozzles are disposed under the bottom of the semiconductor wafer, and two of the spray nozzles are configured to discharging the mist spray at different angles relative to the semiconductor wafer.

* * * * *